(12) United States Patent
Okumura

(10) Patent No.: US 11,984,498 B2
(45) Date of Patent: May 14, 2024

(54) SEMICONDUCTOR DEVICE AND METHOD OF MANUFACTURING SAME

(71) Applicant: FUJI ELECTRIC CO., LTD., Kawasaki (JP)

(72) Inventor: Keiji Okumura, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 207 days.

(21) Appl. No.: 17/037,209

(22) Filed: Sep. 29, 2020

(65) Prior Publication Data

US 2021/0013339 A1 Jan. 14, 2021

Related U.S. Application Data

(63) Continuation of application No. 16/182,199, filed on Nov. 6, 2018, now Pat. No. 10,840,369.

(30) Foreign Application Priority Data

Dec. 6, 2017 (JP) ................................. 2017-234637

(51) Int. Cl.
*H01L 29/78* (2006.01)
*H01L 21/04* (2006.01)
(Continued)

(52) U.S. Cl.
CPC ........ *H01L 29/7813* (2013.01); *H01L 21/046* (2013.01); *H01L 29/086* (2013.01);
(Continued)

(58) Field of Classification Search
CPC ............. H01L 29/7813; H01L 29/0878; H01L 29/086; H01L 29/1095; H01L 29/1608; H01L 29/7811
See application file for complete search history.

(56) References Cited

U.S. PATENT DOCUMENTS

2006/0057796 A1    3/2006   Harada et al.
2013/0099251 A1    4/2013   Hiyoshi et al.
(Continued)

FOREIGN PATENT DOCUMENTS

JP    2002185015 A    6/2002
JP    2003197921 A    7/2003
(Continued)

OTHER PUBLICATIONS

Restriction Office Action dated Sep. 26, 2019, in U.S. Appl. No. 16/182,199.
(Continued)

*Primary Examiner* — Samuel A Gebremariam
*Assistant Examiner* — Jonas T Beardsley

(57) ABSTRACT

A semiconductor device includes a current spreading region of the first conductivity type provided on a drift layer and having a higher impurity density than the drift layer; a base region of a second conductivity type provided on the current spreading region; a base contact region of the second conductivity type provided in a top part of the base region and having a higher impurity density than the base region; and an electrode contact region of the first conductivity type provided in a top part of the base region that is laterally in contact with the base contact region, the electrode contact region having a higher impurity density than the drift layer, wherein a density of a second conductivity type impurity element in the base contact region is at least two times as much as a density of a first conductivity type impurity element in the electrode contact region.

8 Claims, 9 Drawing Sheets

(51) Int. Cl.
  *H01L 29/08*   (2006.01)
  *H01L 29/10*   (2006.01)
  *H01L 29/16*   (2006.01)
  *H01L 29/36*   (2006.01)
  *H01L 29/423*  (2006.01)
  *H01L 29/66*   (2006.01)

(52) U.S. Cl.
  CPC ...... *H01L 29/0865* (2013.01); *H01L 29/1095* (2013.01); *H01L 29/1608* (2013.01); *H01L 29/4236* (2013.01); *H01L 29/66068* (2013.01); *H01L 29/7811* (2013.01); *H01L 29/36* (2013.01)

(56) References Cited

U.S. PATENT DOCUMENTS

| | | | |
|---|---|---|---|
| 2016/0099316 A1 | 4/2016 | Arai et al. | |
| 2016/0133741 A1* | 5/2016 | Matsuki | H01L 29/66068 257/77 |
| 2016/0247910 A1 | 8/2016 | Suzuki et al. | |
| 2016/0322227 A1 | 11/2016 | Arai et al. | |
| 2017/0141186 A1* | 5/2017 | Shiomi | H01L 21/046 |
| 2017/0365709 A1* | 12/2017 | Ohashi | H01L 29/0882 |
| 2018/0315819 A1* | 11/2018 | Tanaka | H01L 29/7811 |
| 2019/0074360 A1 | 3/2019 | Hiyoshi et al. | |
| 2020/0203482 A1* | 6/2020 | Kaji | H01L 29/78 |

FOREIGN PATENT DOCUMENTS

| | | |
|---|---|---|
| JP | 200676553 A | 3/2006 |
| JP | 2011-23757 A | 2/2011 |
| JP | 2013-89836 A | 5/2013 |
| JP | 201572999 A | 4/2015 |
| JP | 201676553 A | 5/2016 |
| JP | 201692257 A | 5/2016 |
| WO | 02049114 A2 | 6/2002 |
| WO | 2016/002766 A1 | 1/2016 |
| WO | 2017/179377 A1 | 10/2017 |

OTHER PUBLICATIONS

Non-Final Office Action dated Jan. 9, 2020, in U.S. Appl. No. 16/182,199.
Notice of Allowance dated Jul. 9, 2020 in U.S. Appl. No. 16/182,199.
Japanese Office Action from Japanese Application No. 2017-234637 dated Oct. 19, 2021, with English translation (17 pages total).
Japanese Office Action dated Mar. 15, 2022 from Japanese Application No. 2017-234637.
Japanese Office Action dated Oct. 31, 2023 for Japanese Application No. 2022-143148.

* cited by examiner

SEMICONDUCTOR DEVICE AND METHOD OF MANUFACTURING SAME

CROSS REFERENCE TO RELATED APPLICATIONS

This application is filed as a continuation application of U.S. patent application Ser. No. 16/182,199, filed on Nov. 6, 2018, in the United States Patent and Trademark Office, which claims the priority benefit of Japanese Patent Application No. 2017-234637, filed on Dec. 6, 2017, in the Japanese Patent Office. The disclosures of U.S. patent application Ser. No. 16/182,199 and Japanese Patent Application No. 2017-234637 are incorporated by reference herein in their entireties.

BACKGROUND

Technical Field

The present invention relates to a semiconductor device, and particularly relates to a semiconductor device that suppresses an increase in contact resistance and a method of manufacturing the same.

Background Art

In a MOS field effect transistor (MOSFET) that uses silicon (Si), double diffusion is used to form, in a p-type well region, an n$^+$ source region to which a high concentration of impurities has been added. However, the diffusion coefficient of impurity atoms in a silicon carbide (SiC) substrate is extremely low, and it is not possible to use double diffusion. To address this, in a MOSFET that uses SiC, double ion implantation is used to form the p-type well region, and the n$^+$ source region in the well region. In this method, high concentration ion implantation induces a large number of crystal defects. This may cause an increase in contact resistance or ON resistance. To solve such a problem, it has been proposed that a p-type well region be deposited and then a high concentration source region be selectively formed via ion implantation (see Patent Document 1).

In recent years, in MOSFETs that use SIC, a p$^+$ base contact layer and an n$^+$ source region have been formed adjacent to each other on a p-type base region. Ordinarily, the n-type source region is selectively formed via ion implantation first, and next the p-type base contact region is selectively formed via ion implantation so as to contact the source region. The impurity densities for the source region and the base contact region are both around several $10^{20}$ cm$^{-3}$ ($10^{20}$ level). In this case, there are cases where the base contact region overlaps the source region due to mask alignment deviations of the selective ion implantation for the base contact region. The impurity densities implanted into the source region and base contact region are around the same, and thus the overlapping portion will have higher resistance due to carrier compensation. Due to this, contact resistance increases, and this is a cause of an increase in ON resistance, an increase in forward voltage of the body diode, etc.

RELATED ART DOCUMENT

Patent Document

Patent Document 1: Japanese Patent Application Laid-Open Publication No. 2011-23757

SUMMARY

In view of the aforementioned problems, the present invention aims at providing a semiconductor device and a method of manufacturing the same that can prevent mask alignment deviations and can suppress an increase in ON resistance and forward voltage of a body diode.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: (a) a drift layer of a first conductivity type; (b) a current spreading region of the first conductivity type provided on the drift layer and having a higher impurity density than the drift layer; (c) a base region of a second conductivity type provided on the current spreading region; (d) a base contact region of the second conductivity type provided in a top part of the base region and having a higher impurity density than the base region; and (e) an electrode contact region of the first conductivity type provided in a top part of the base region that is laterally in contact with the base contact region, the electrode contact region having a higher impurity density than the drift layer, (f) wherein a density of a second conductivity type impurity element in the base contact region is at least two times as much as a density of a first conductivity type impurity element in the electrode contact region.

In another aspect, the present disclosure provides a method of manufacturing a semiconductor device, the method including: (a) epitaxially growing a first epitaxial layer of a first conductivity type on a top surface of a drift layer of the first conductivity type; (b) selectively implanting impurity ions of the first conductivity type into the first epitaxial layer so as to be of a higher impurity density than a impurity density of the first epitaxial layer, thereby forming a current spreading region in an active region and forming a channel stopper region on an outer edge of a termination region surrounding the active region; (c) epitaxially growing a base region of a second conductivity type on the first epitaxial layer; (d) selectively implanting second conductivity type impurity ions into the base region, thereby selectively embedding a base contact region of the second conductivity type in a top part of the base region with a higher impurity density than the base region; and (e) implanting first conductivity type impurity ions into an entire surface of the base region including the embedded base contact region at a dosage lower than a dosage of the second conductivity type impurity ions implanted to form the base contact region, thereby forming an electrode contact region of the first conductivity type in a top part of the base region that is laterally in contact with the base contact region.

The present invention makes it possible to provide a semiconductor device and a method of manufacturing the same that can prevent mask alignment deviations.

It is to be understood that both the foregoing general description and the following detailed description are exemplary and explanatory, and are intended to provide further explanation of the invention as claimed.

BRIEF DESCRIPTION OF THE DRAWINGS

FIG. 7 is a cross-sectional view of a step after FIG. 6 for describing one example of the method of manufacturing the semiconductor device according to the embodiment of the present invention.

FIG. 8 is a cross-sectional view of a step after FIG. 7 for describing one example of the method of manufacturing the semiconductor device according to the embodiment of the present invention.

DETAILED DESCRIPTION OF EMBODIMENTS

Figure 1:
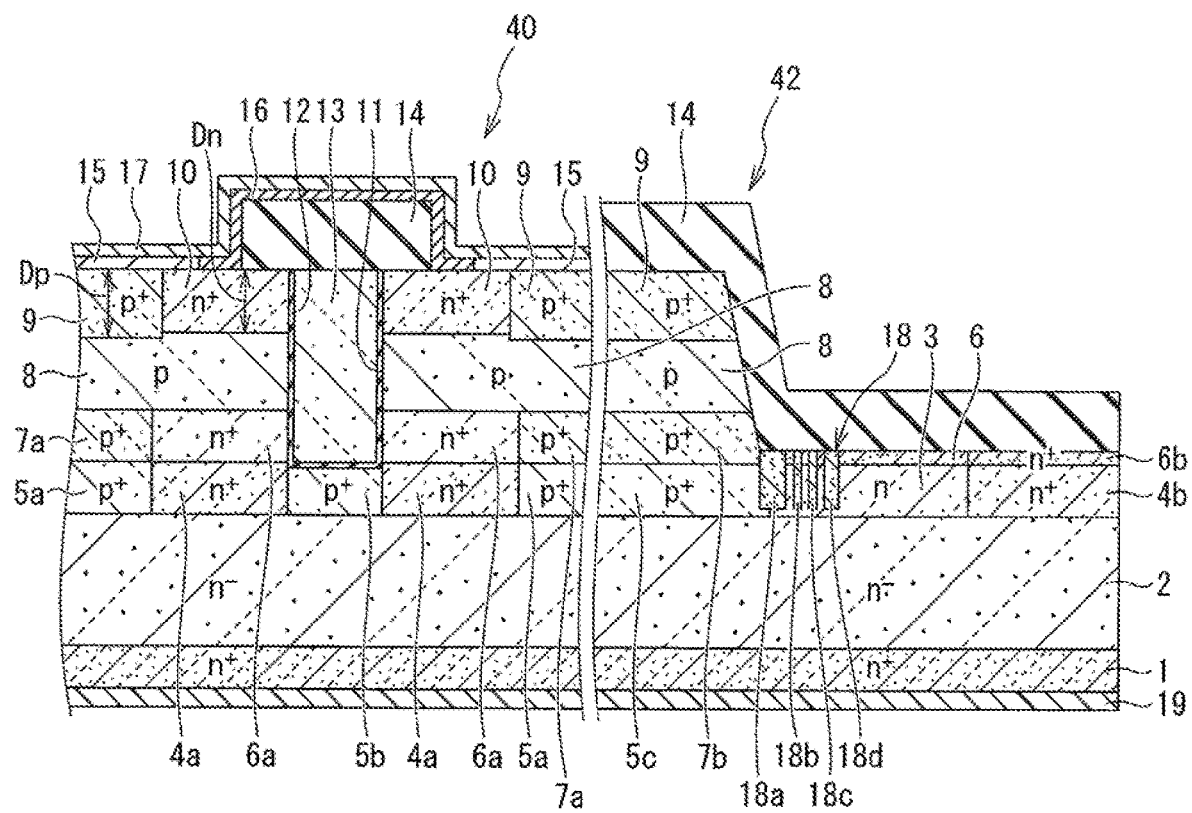
FIG. 1 is a cross-sectional view showing one example of a semiconductor device according to an embodiment of the present invention.

Embodiment of the present invention will be described below with reference to the drawings. In the drawings, portions that are the same or similar will be assigned the same or similar reference characters and redundant explanations will be omitted. However, the drawings are schematic, and the relationship between thickness and planar dimensions, the ratio of the thickness of each layer, etc. may differ in practice. Furthermore, there can be parts for which the relationship between dimensions, ratios, etc. differ even among the drawings. Embodiment shown below illustratively indicates a device and method for carrying out the technical idea of the present invention, and the technical idea of the present invention is not limited to the material, shape, structure, arrangement, etc. of the constituent components described below.

In the present specification, "first main electrode region" means a semiconductor region serving as either a source region or a drain region in a field effect transistor (FET) or static induction transistor (SIT). In an insulated gate bipolar transistor (IGBT), "first main electrode region" means a semiconductor region serving as either an emitter region or a collector region. In a static inductor thyristor (SI thyristor) or gate turn-off thyristor (GTO), "first main electrode region" means a semiconductor region serving as either the anode region or cathode region. "Second main electrode region" means, in an FET or SIT, a semiconductor region serving as whichever of the source region or drain region that is not the first main electrode region. In an IGBT, "second main electrode region" means a region serving as whichever of the emitter region or collector region that is not the first main electrode region. In an SI thyristor or GTO, "second main electrode region" means a region serving as whichever of the anode region or cathode region that is not the first main electrode region. Thus, if the "first main electrode region" is the source region, then "second main electrode region" means the drain region. If the "first main electrode region" is the emitter region, then "second main electrode region" means the collector region. If the "first main electrode region" is the anode region, then "second main electrode region" means the cathode region. If the bias relationship is interchanged, then in an FET or the like, the function of the "first main electrode region" and the function of the "second main electrode region" are interchangeable.

In addition, the definition of directions such as up-down in the description below are merely definitions for convenience of explanation and do not limit the technical idea of the present invention. For example, if an object is observed after being rotated 90°, up-down is converted to left-right, and if observed after being rotated 180°, up-down is inversed. Further, in the description below, the first conductivity type is illustratively described as n-type and the second conductivity as p-type, which is the opposite conductivity type of the first conductivity type. However, an inverse relationship may be selected for the conductivity types, where the first conductivity type is p-type and the second conductivity type is n-type, which is the opposite conductivity type of the first conductivity type. A "+" or "−" attached to an "n" or "p" signifies that the semiconductor region has higher or lower impurity element density, respectively, than a semiconductor region not having the "+" or "−". However, this does not mean that semiconductor regions that are both labelled "n" have exactly the same impurity densities.

Figure 2:
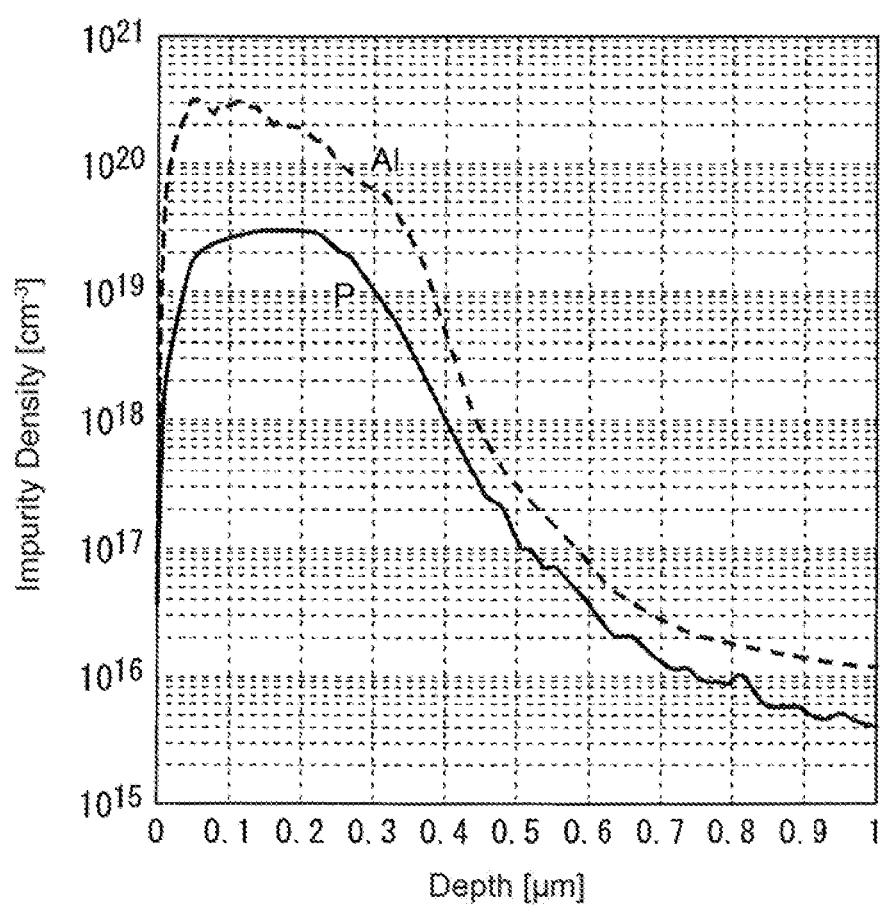
FIG. 2 is a view showing one example of impurity densities of the semiconductor device according to the embodiment of the present invention.

As is described below, one characteristic of the present invention is preventing an increase in contact resistance caused by mask alignment deviation. In other words, the present invention exhibits marked effects in preventing an increase in forward voltage of a body diode and ON resistance of an insulated gate transistor such as a MOS transistor. The insulated gate transistor can also be more comprehensively referred to as a "MIS transistor," but MIS transistor includes MISFETs, MISSITs, etc. There are also MIS composite type SI thyristors, and thus the present invention can also be applied to SI thyristors. Furthermore, it is also possible to prevent leakage current at the interface between the insulating film layer and the semiconductor layer, which serves as a high voltage withstand structure at the periphery of a power semiconductor device. In the description of the embodiment below, as shown in FIG. 2, a MOS transistor with a trench gate structure is illustratively described as a representative example for sake of convenience. However, it shall be obvious to a person skilled in the art, as understood from the spirit of the present invention described below, that similar effects are exhibited even with a planar structure, such as a planar gate MOS transistor.

Embodiment

As shown in FIG. 1, a semiconductor device according to Embodiment 1 of the present invention includes an active region 40, and a mesa structure termination region 42 disposed on the periphery of the active region 40 so as to surround the active region. In FIG. 1, a case is illustratively shown where the active region 40 contains a trench gate structure MOSFET provided as an active element on top of a drift layer 2 of a first conductivity type (n$^-$).

In the active region 40, an n$^+$ current spreading region (CSL) (4a, 6a) is disposed with a higher impurity density than the drift layer 2 on the top surface of the drift layer 2. A base region 8 of a second conductivity type (p-type) is disposed on the top surface of the current spreading region (4a, 6a). The drift layer 2 and base region 8 are each formed by epitaxially grown layers made of SiC (hereinafter abbreviated as "epitaxial layers"). The current spreading region (4a, 6a) is formed by implantation layers 4a, 6a in which an n-type impurity has been ion implanted in an epitaxial layer.

A p$^+$ base contact region 9 of a higher impurity density than the base region 8 is selectively provided in the top part of the base region 8. An n$^+$ first main electrode region (source region) 10 of a higher impurity density than the current spreading region (4a, 6a) is selectively provided in the top part of the base region 8 so as to contact the base contact region 9. The base contact region 9 is provided via ion implantation of a p-type impurity such as aluminum (Al) at an impurity density of $1 \times 10^{20}$ cm$^{-3}$ to $10 \times 10^{20}$ cm$^{-3}$, for example, and the source region 10 is provided via ion implantation of an n-type impurity such as phosphorous (P) at an impurity density of $1 \times 10^{19}$ cm$^{-3}$ to $10 \times 10^{19}$ cm$^{-3}$, for example. It is desirable that the impurity density of the source region 10 be around ½ or less of the impurity density of the base contact region 9. The depth Dp between the top surface and bottom surface of the base contact region 9 is around 0.4 μm to 0.6 μm, and the depth Dn between the top surface and bottom surface of the main electrode region 10 is around 0.2 μm to 0.5 μm.

A trench 11 is provided going through the base region 8 from the top surface of the source region 10 and base region 8. A gate insulating film 12 is provided on the bottom surface and side surfaces of the trench 11. In addition to a silicon oxide film (SiO$_2$ film), a single layer film of any one of a silicon oxynitride (SiON) film, strontium oxide (SrO) film, silicon nitride (Si$_3$N$_4$) film, aluminum oxide (Al$_2$O$_3$) film, magnesium oxide (MgO) film, yttrium oxide (Y$_2$O$_3$) film, hafnium oxide (HfO$_2$) film, zirconium oxide (ZrO$_2$) film, tantalum oxide (Ta$_2$O$_5$) film, and bismuth oxide (Bi$_2$O$_3$) film, or a composite film in which a plurality of these films are laminated, or the like may be used as the gate insulating film 12.

A gate electrode 13 is embedded in the trench 11 with the gate insulating film 12 interposed therebetween. The material of the gate electrode 13 can be a polysilicon layer (doped polysilicon layer) to which a high impurity density of an impurity such as phosphorous (P) has been added.

A p$^+$ gate bottom protection region 5b is provided inside the current spreading region (4a, 6a) so as to contact the bottom of the trench 11. A first base bottom embedded region 5a is provided inside the current spreading region (4a, 6a), below the base contact region 9, at the same depth as the gate bottom protection region 5b, and separated from the gate bottom protection region 5b. A second base bottom embedded region 7a is provided in the top part of the current spreading region (4a, 6a) so as to be interposed between the top surface of the first base bottom embedded region 5a and the bottom surface of the base region 8.

A source electrode (not shown) is disposed on the top surface of the gate electrode 13 with an interlayer insulating film 14 interposed therebetween so as to be separated from a gate surface electrode (not shown) positioned in the depth of the sheet of drawing. The interlayer insulating film 14 can be a non-doped silicon oxide film (SiO$_2$ film) that does not contain phosphorous (P) or boron (B), which is referred to as "NSG." However, the interlayer insulating film 14 may be a silicon oxide film to which phosphorous has been added (PSG), a silicon oxide film to which boron has been added (BSG), a silicon oxide film to which boron and phosphorous have been added (BPSG), a silicon nitride film (Si$_3$N$_4$), or the like. A source contact layer 15, bottom barrier metal layer 16, and top barrier metal layer 17 are disposed in layers below the source electrode. The source contact layer 15 is disposed so as to metallurgically contact the source region 8 and the base contact region 9. For example, the source contact layer 15 can be a nickel (Ni) film, the bottom barrier metal layer 16 can be a titanium nitride (TiN) film, and the top barrier metal layer 17 can be a titanium (Ti)/TiN/Ti laminate structure. The source electrode can be an aluminum (Al) film, for example. The gate surface electrode can be the same material as the source electrode.

An n$^+$ second main electrode region (drain region) 1 is disposed on the bottom surface of the drift layer 2. The drain region 1 is formed by a semiconductor substrate made of SiC (SiC substrate). A second main electrode region (drain region) 19 is disposed on the bottom surface of the drain region 1. The drain electrode 19 can be a single layer film made of gold (Au), a metal film in which Al, nickel (Ni), and Au have been laminated in the stated order, or the like, and a metal film such as molybdenum (Mo) or tungsten (W) may be further laminated on the bottommost layer thereof, for example.

Focusing on the termination region 42 side positioned on the right side of FIG. 1, an n-type mesa bottom surface layer 3 is disposed on the top surface of the drift layer 2 at the same thickness as the first base bottom embedded region 5a, gate bottom protection region 5b, etc. provided in the active region 40, thereby forming the bottom surface of a mesa structure. A channel stopper region (4b, 6b) of the first conductivity type and with a higher impurity density than the mesa bottom surface layer 3 is provided along the bottom surface of the mesa structure going from the mesa bottom surface layer 3 side to the outer edge of the termination region 42. The ends of the base contact region 9 and base region 8 are exposed to the mesa surface positioned on the active region 40 side of the termination region 42. A relaxation region (5c, 7b) of the second conductivity type and with a higher impurity density than the base region 8 is inserted between the top surface of the drift layer 2 and the bottom surface of the base region 8. The relaxation region (5c, 7b) extends to the active region 40 side more inside than the mesa structure portion. A mesa inclined surface is provided that goes downward from the base contact region 9 through the base region 8 so as to reach the relaxation region (5c, 7b). A junction termination extension (JTE) region 18 is provided inside the mesa bottom surface layer 3 going from the bottom end of the mesa inclined surface toward the outer edge. The JTE region 18 includes a plurality of p-type spatial modulation parts 18a, 18b, 18c, and 18d.

FIG. 2 shows an impurity distribution measured from the top surface of the base contact region 9 toward the base region 8. As shown in FIG. 2, the n-type impurity P implanted into the source region 10 is also implanted at the same time as the p-type impurity Al in the base contact region 9. The ion implantation mask for formation of the base contact region 9 is prepared and ion implantation is selectively performed so that only P is implanted into the source region 10. Al is implanted at a depth of approximately 0.5 μm from the top surface at a maximum impurity density of around $3\times10^{20}$ cm$^3$. P is implanted at a depth of approximately 0.4 μm from the top surface at a maximum impurity density of around $3\times10^{19}$ cm$^{-3}$. In the semiconductor device according to the embodiment of the present invention, the dosage amount of the impurity ions implanted into the source region 10 is adjusted such that the impurity density implanted into the source region 10 is ½ or less of the impurity density implanted into the base contact region 9. It is preferable that the dosage amount of the impurity ions implanted into the source region 10 be adjusted such that the impurity density implanted into the source region 10 is around ⅕ or less of the impurity density implanted into the base contact region 9. As can be understood from FIG. 2, it is more preferable for the dosage amount to be adjusted such that the impurity density implanted into the source region 10 is around 1/10 or less of the impurity density implanted into the base contact region 9. Furthermore, the implantation depth in the source region 10 is made at least 0.05 μm shallower than the implantation depth in the base contact region 9. Accordingly, the impurity density of the base contact region 9 is always higher than that of the source region 10 in the region reaching the base region 8. As a result, even if the ion implantation regions of the source region 10 and base contact region 9 overlap each other, the overlapping portion will not have higher resistance caused by carrier compensation. In the case of n-type, an ohmic contact can be formed even if the impurity density is around $1\times10^{19}$ cm$^{-3}$. However, in the case of p-type, forming an ohmic contact is difficult if the impurity density is below $1\times10^{20}$ cm$^{-3}$.

Figure 3:
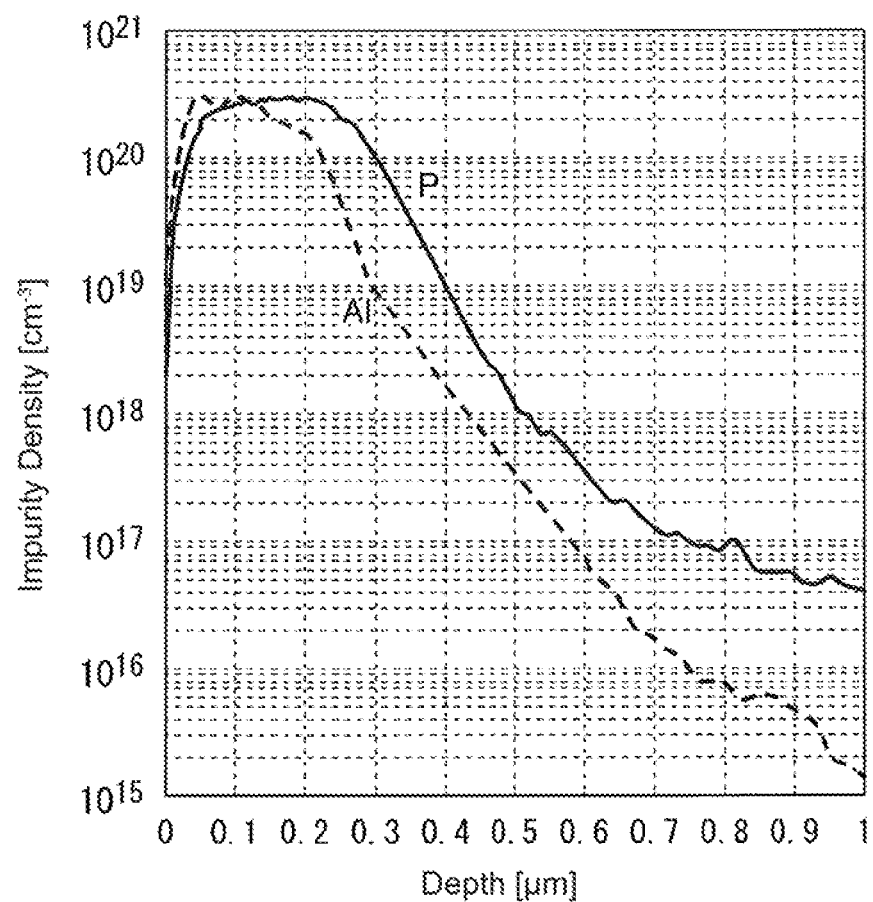
FIG. 3 is a view showing one example of impurity densities of a conventional semiconductor device.

FIG. 3 is a comparative example of an impurity distribution in a base contact region where a p-type impurity and n-type impurity have been implanted with substantially the same implantation amount as is conventional. As shown in FIG. 3, Al and P are both implanted so as to have an implantation amount of around $3\times10^{20}$ cm$^{-3}$. The p-type Al impurity density is high from the surface to approximately 0.1 μm, but the n-type P impurity density is higher deeper than 0.1 μm. Thus, in the comparative example, the impurity densities of Al and P at the base contact region are substantially the same, and resistance is high due to compensation.

As described above, in the semiconductor device according to the embodiment of the present invention, the impurity density in the base contact region 9 is always higher than the impurity density in the source region 10 in the region reaching the base region 8. Due to this, neither the base contact region 9 nor the source region 10 has high resistance caused by carrier compensation, and it is possible to suppress an increase in ON resistance and forward voltage of the body diode. In addition, the termination region 42 is provided with the relaxation region (5c, 7b) and spatial modulation parts 18a, 18b, 18c, and 18d; thus, it is possible to relax electric field concentration. Moreover, the outer edge of the termination region 42 is provided with the channel stopper region (4b, 6b); thus, it is possible to maintain a high voltage applied to the MOSFET. Accordingly, it is possible to improve the withstand voltage of the termination region 42 and to provide a high withstand voltage device.

Next, while referring to FIGS. 4 to 11, one example of a method of manufacturing the semiconductor device according to the embodiment of the present invention will be described for a trench gate type MOSFET. The method of manufacturing the trench gate MOSFET described below is one example, and various other types of methods of manufacturing can be performed, including a modification example of this embodiment, within the scope set forth in the claims.

Figure 4:
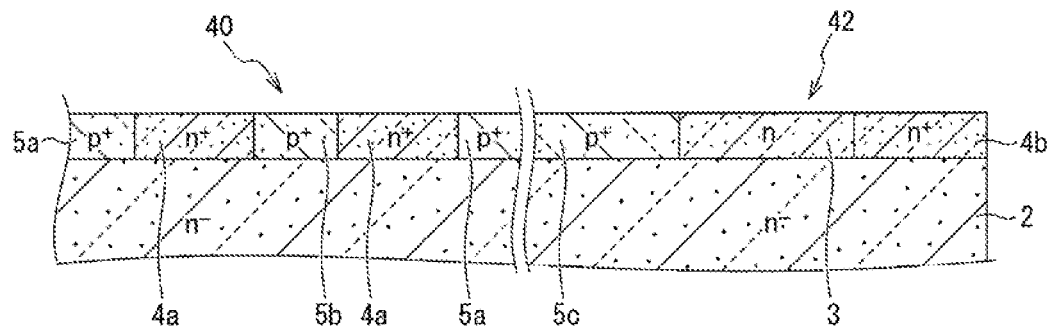
FIG. 4 is a cross-sectional view of a step for describing one example of a method of manufacturing the semiconductor device according to the embodiment of the present invention.

First, an n$^+$ semiconductor substrate (SiC substrate) to which an n-type impurity such as nitrogen (N) has been added is prepared. With this n$^+$ SiC substrate as the drain region (not shown), the n drift layer 2 is epitaxially grown on the top surface of the drain region. Next, the n-type mesa bottom surface layer 3 is epitaxially grown on the top surface of the drift layer 2. Photolithography and ion implantation or the like are used to implant p-type impurity ions while appropriately masking the vicinity of the outer edge of the termination region 42. Next, photolithography and ion implantation or the like are used to selectively implant n-type impurity ions. As shown in FIG. 4, the implanted ions are activated to selectively form the n$^+$ implantation players 4a, 4b and p$^+$ implantation layers 5a, 5b, 5c.

Figure 5:
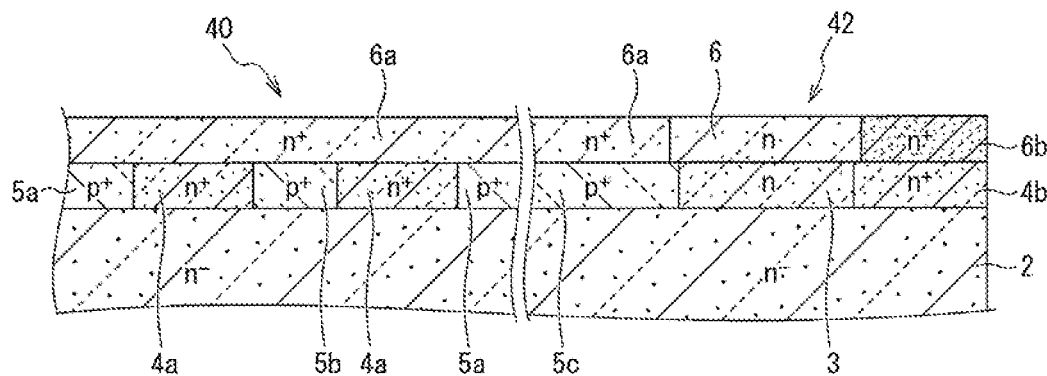
FIG. 5 is a cross-sectional view of a step after FIG. 4 for describing one example of the method of manufacturing the semiconductor device according to the embodiment of the present invention.

A new growth layer 6 is epitaxially grown on the top surface of the ion-implanted mesa bottom surface layer 3. Next, photolithography and ion implantation or the like are used to selectively implant n-type impurity ions into the growth layer 6. As shown in FIG. 5, the implanted ions are activated to form the n$^+$ implantation layer 6a in the active region 40 and to form the implantation layer 6b in the termination region 42. The implantation layer 6b is provided on the top surface of the implantation layer 4b.

Figure 6:
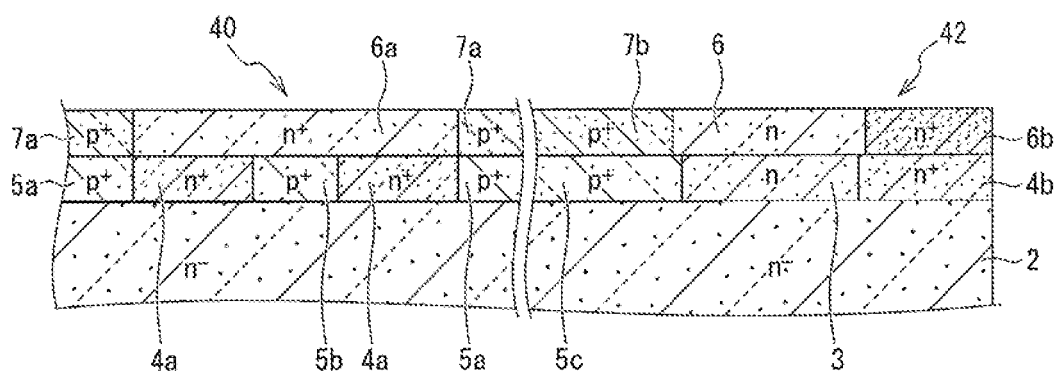
FIG. 6 is a cross-sectional view of a step after FIG. 5 for describing one example of the method of manufacturing the semiconductor device according to the embodiment of the present invention.

Next, photolithography and ion implantation or the like are used to selectively implant p-type impurity ions. As shown in FIG. 6, the implanted ions are activated to form the p$^+$ implantation layer 7a in the active region 40 and to form the implantation layer 7b in the termination region 42. The implantation layer 7a is formed on the top surface of the implantation layer 5a to constitute the base bottom embedded region (5a, 7a). The implantation layer 7b is provided on the top surface of the implantation layer 5c to constitute the relaxation region (5c, 7b).

Figures 7, 8:
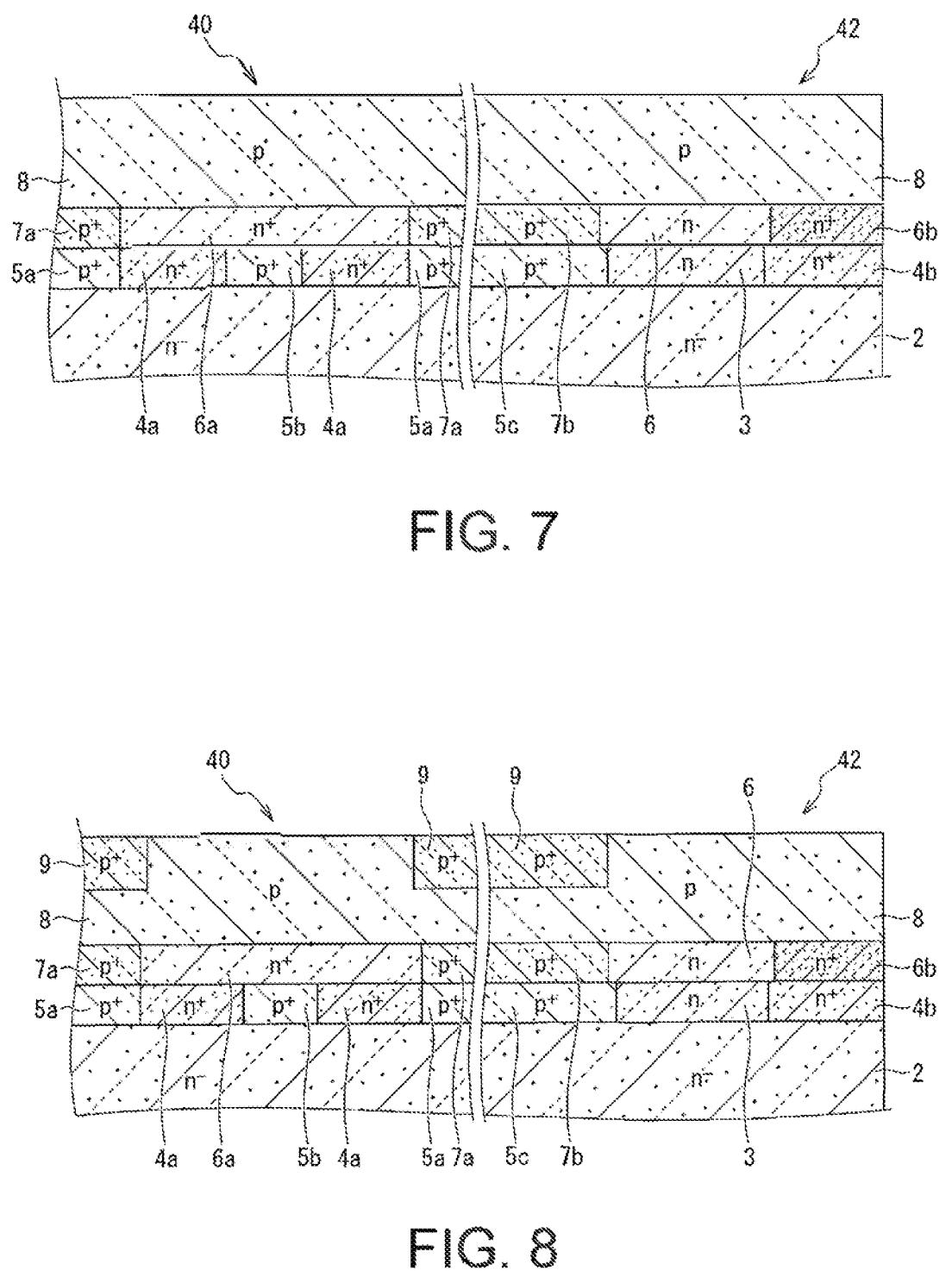

As shown in FIG. 7, the p-type base region 8 is epitaxially grown on the top surface of the ion-implanted growth layer 6. Thereafter, photolithography and ion implantation or the like are used to selectively implant p-type impurity ions. As shown in FIG. 8, the implanted ions are activated to form the base contact region 9 in the top part of the base region 8. The base contact region 9 is disposed above the base bottom embedded region (5a, 7a). The activation process of the implanted ions may be performed at the same time as the activation of the source region 10.

Figure 9:
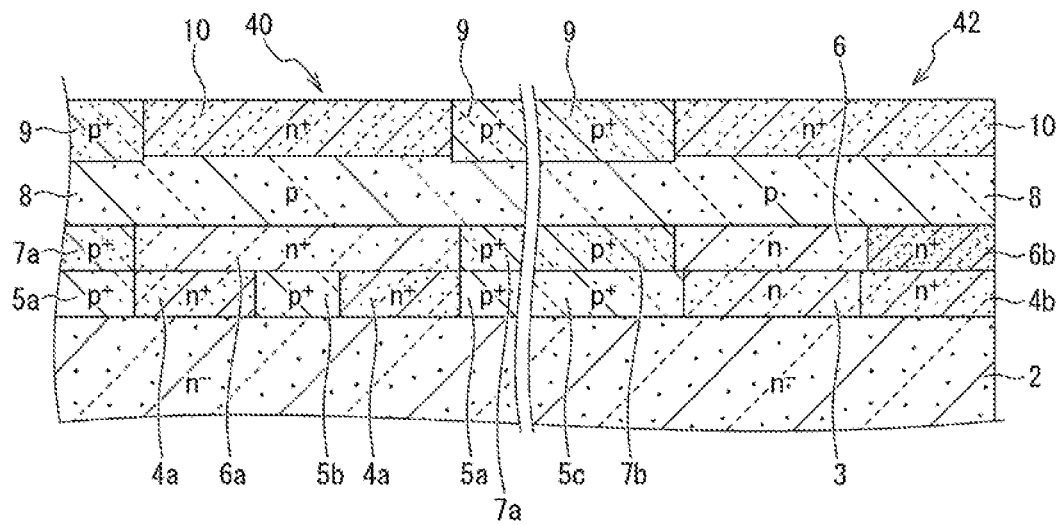
FIG. 9 is a cross-sectional view of a step after FIG. 8 for describing one example of the method of manufacturing the semiconductor device according to the embodiment of the present invention.

Next, ion implantation or the like is used to implant the n-type impurity ions into the entire surface of the base region 8 where the base contact region 9 is formed without using a mask. As shown in FIG. 9, the implanted ions are activated to form the source region 10 between the base contact regions 9. The impurity implantation amount in the source region 10 is ½ or less of the impurity implantation amount of the base contact region 9. The implantation depth in the source region 10 is at least 0.05 μm shallower than the implantation depth in the base contact region 9.

Figure 10:
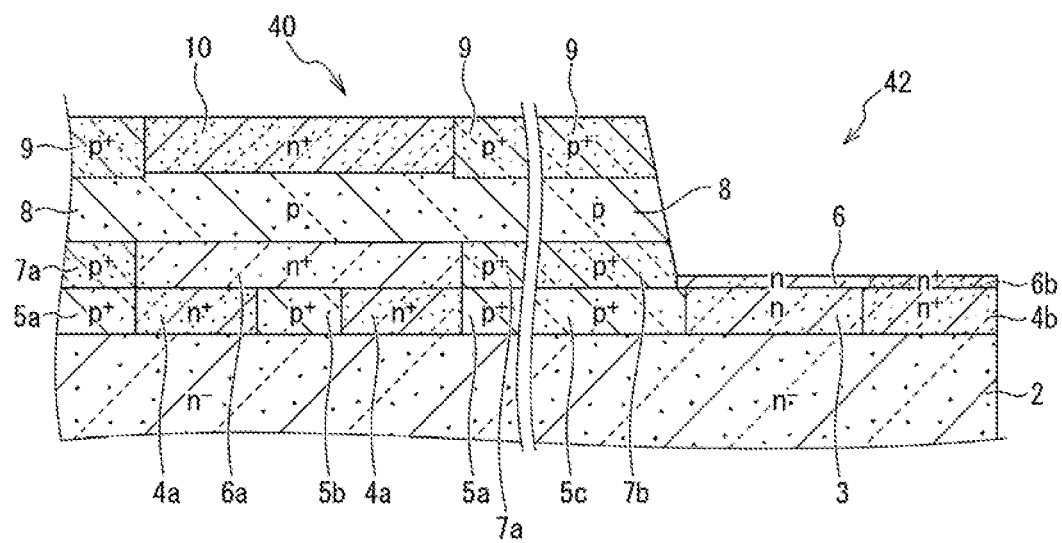
FIG. 10 is a cross-sectional view of a step after FIG. 9 for describing one example of the method of manufacturing the semiconductor device according to the embodiment of the present invention.
Figure 11:
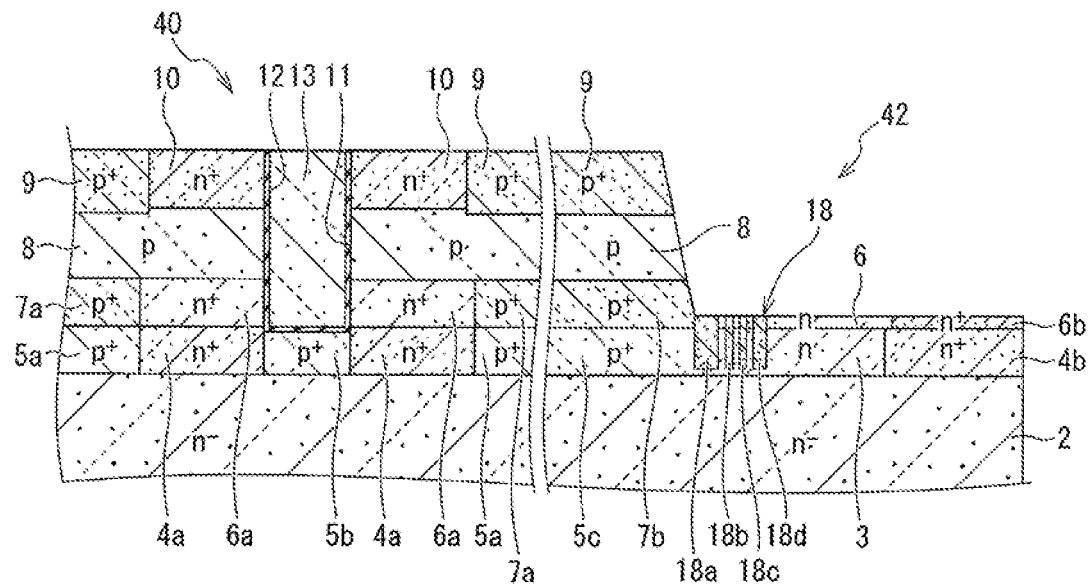
FIG. 11 is a cross-sectional view of a step after FIG. 10 for describing one example of the method of manufacturing the semiconductor device according to the embodiment of the present invention.

Photolithography and dry etching such as reactive ion etching (RIE) or the like are used to perform mesa etching of the termination section, and a portion of the semiconductor layer in the termination region 42 is removed to form a level-difference having a mesa inclined surface. As shown in FIG. 10, the dry etching is performed at a depth where the implantation layer 6b provided on the outer edge of the termination region 42 remains. Furthermore, the mask for mesa etching of the termination section is narrower than the base contact region 9 of the termination region 42, so that a portion of the base contact region 9 is removed. As a result, the surface of the implantation layer 6b is exposed to a flat part. The p$^+$ base contact region 9, p-type base region 8, and p$^+$ implantation layer 7b are exposed to the mesa inclined surface.

Photolithography and dry etching or the like are used to form the trench 11. Next, chemical vapor deposition (CVD) or the like is used to deposit an insulating film. Thereafter, photolithography and dry etching or the like are used to embed a polysilicon layer in the trench 11 to form a gate structure made of the gate insulating film 12 and gate electrode 13. Afterwards, photolithography and ion implantation or the like are used to provide the JTE region 18 having the spatial modulation parts 18a, 18b, 18c, 18d inside the growth layer 6 going from the bottom end of the mesa inclined surface formed in the termination region 42 toward the outer edge of the termination region 42.

Next, the interlayer insulating film 14 is formed on the gate structure and on an area from the mesa inclined surface to the outer edge of the termination region 42. Thereafter, the source contact layer 15, bottom barrier metal layer 16, and top barrier metal layer 17 are formed on the top surface, and the drain electrode 19 is formed on the rear surface, thus completing the MOSFET shown in FIG. 1.

Figure 12:
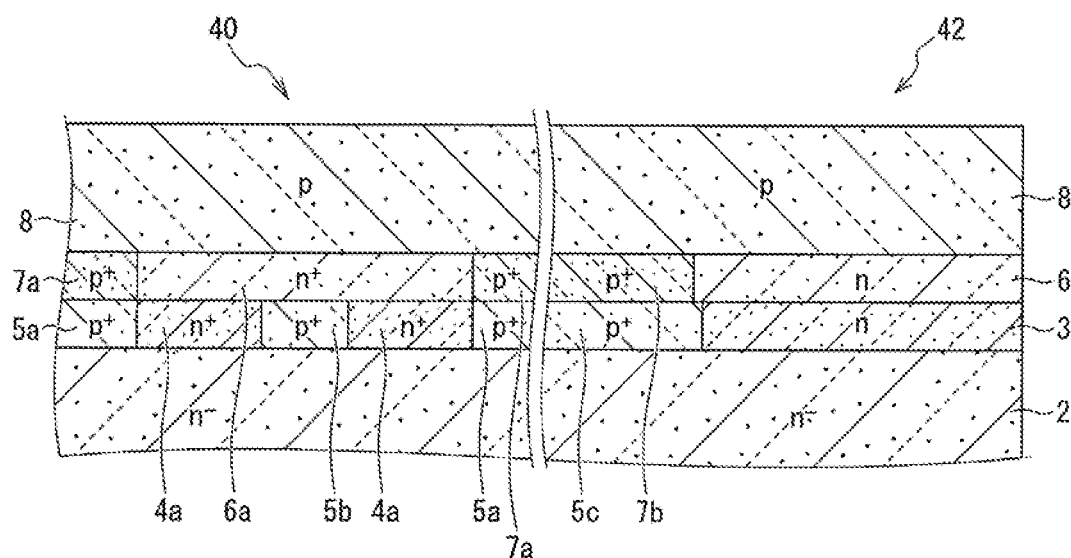
FIG. 12 is a cross-sectional view of a step for describing one example of a method of manufacturing a conventional semiconductor device.

Next, while referring to FIGS. 12 to 16, a method of manufacturing a conventional MOSFET will be described with emphasis on the points differing from the method of manufacturing the MOSFET according to the embodiment of the present invention. The conventional manufacturing method differs from the embodiment of the present invention shown in FIG. 4 and FIG. 5 in that ion implantation for the n$^+$ channel stopper region (4b, 6b) is not performed after the mesa bottom surface layers 3, 6 are epitaxially grown. Accordingly, the mesa bottom surface layers 3, 6 remain on the outer edge of the termination region 42. As shown in FIG. 12, the p-type base region 8 is epitaxially grown on the top surface of the growth layer 6 where the p$^+$ implantation layers 7a, 7b are formed.

Figure 13:
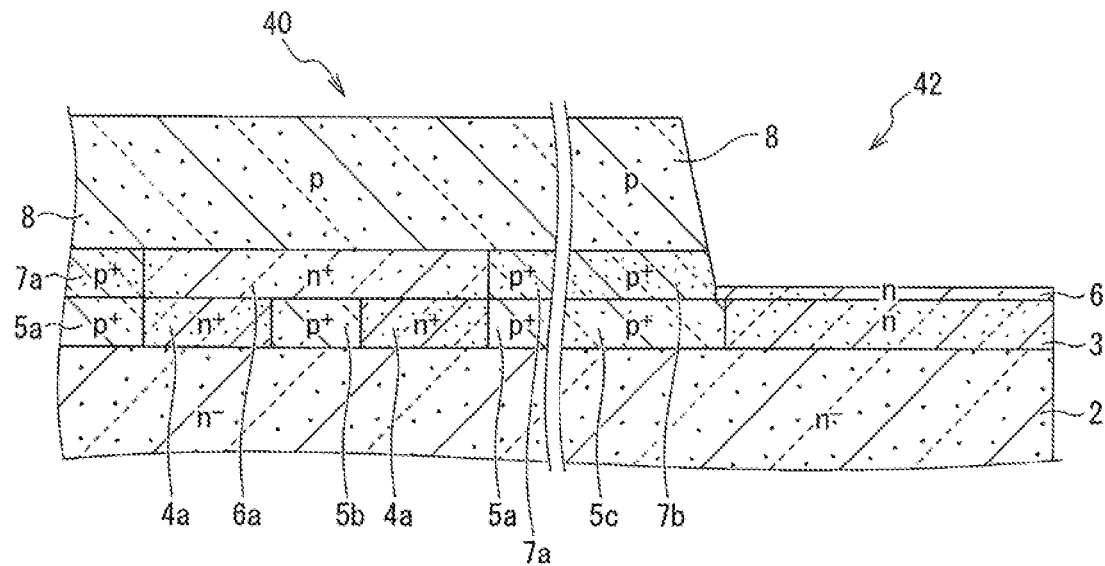
FIG. 13 is a cross-sectional view of a step after FIG. 12 for describing one example of the method of manufacturing the conventional semiconductor device.

Photolithography and dry etching such as reactive ion etching (RIE) or the like are used to perform mesa etching of the termination section, and a portion of the semiconductor layer in the termination region 42 is removed to form a level-difference having a mesa inclined surface. As shown in FIG. 13, the dry etching is performed at a depth where the growth layer 6 provided on the outer edge of the termination region 42 remains. As a result, the surface of the growth layer 6 is exposed to a flat part. The p-type base region 8 and p$^+$ implantation layer 7b are exposed to the mesa inclined surface.

Figure 14:
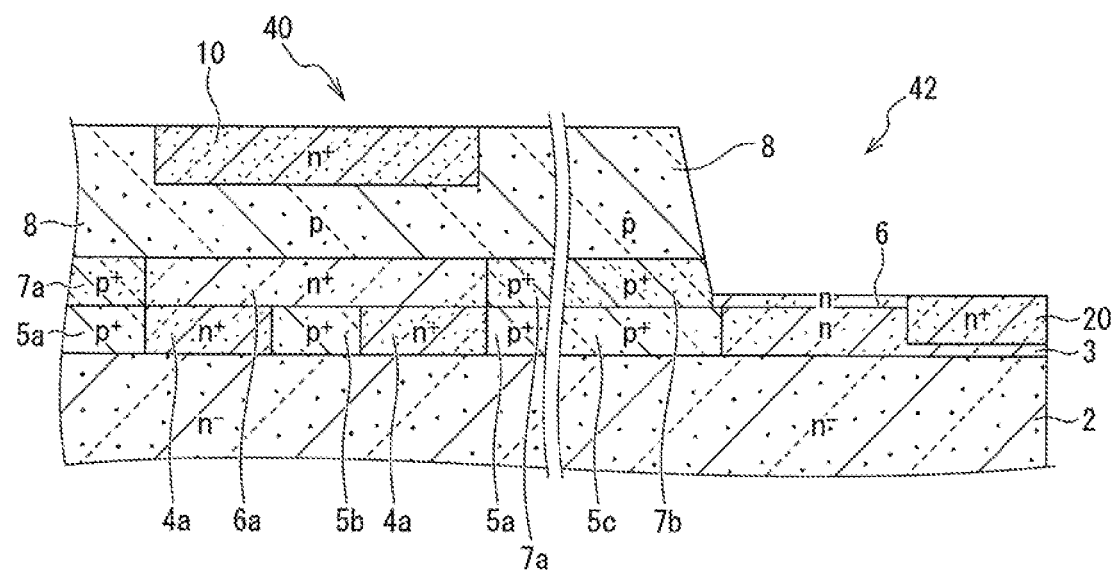
FIG. 14 is a cross-sectional view of a step after FIG. 13 for describing one example of the method of manufacturing the conventional semiconductor device.

Thereafter, photolithography and ion implantation or the like are used to selectively implant the n-type impurity ions. As shown in FIG. 14, the source region 10 is selectively formed in the top part of the base region 8. At the same time, the n-type impurity is implanted into the outer edge of the termination region 42 to form the n$^+$ channel stopper region 20. Thus, in the conventional manufacturing method, the source region 10 and channel stopper region 20 are formed with selective ion implantation that uses a mask.

Figure 15:
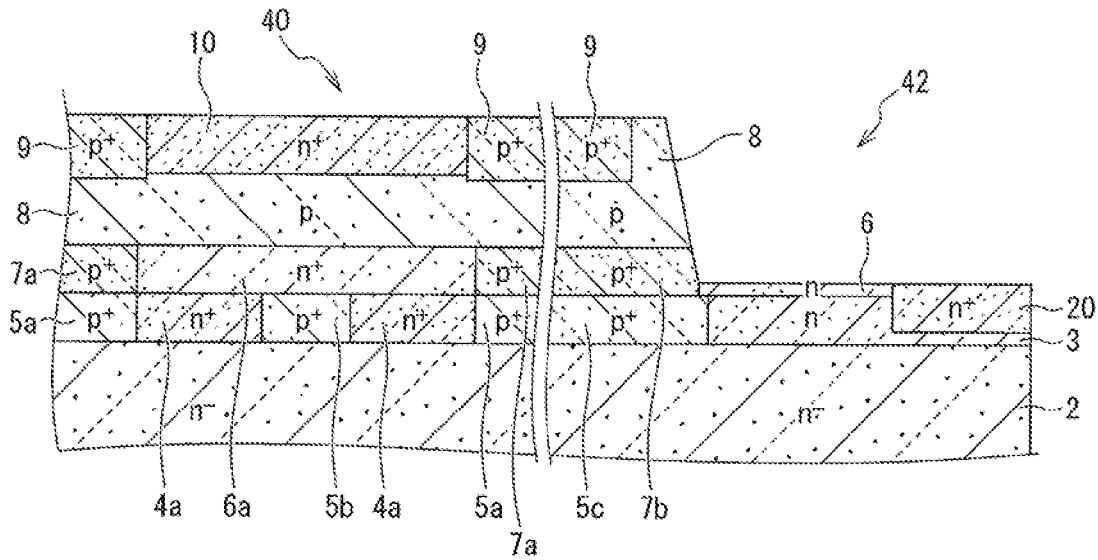
FIG. 15 is a cross-sectional view of a step after FIG. 14 for describing one example of the method of manufacturing the conventional semiconductor device.
Figure 16:
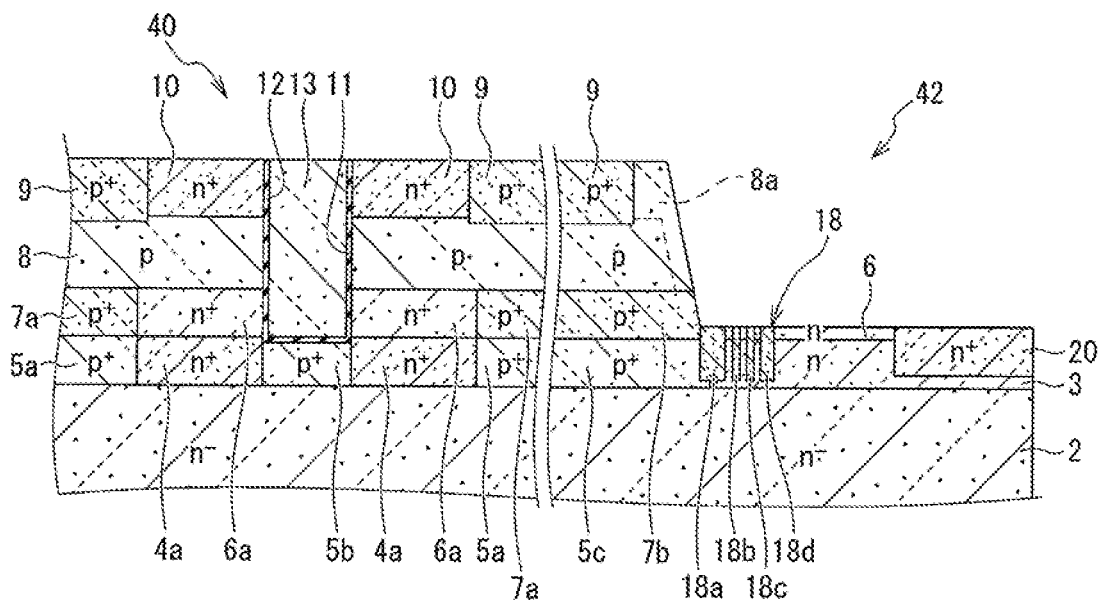
FIG. 16 is a cross-sectional view of a step after FIG. 15 for describing one example of the method of manufacturing the conventional semiconductor device.

Photolithography and ion implantation or the like are used to selectively implant the p-type impurity ions. As shown in FIG. 15, the base contact regions 9 are formed so as to sandwich the source region 10. The base contact region 9 extending to the termination region 42 is not exposed to the mesa inclined surface that has been termination-etched. The ion implantation mask for the base contact region 9 is made narrower than the termination etching mask so that the p-type impurities are not implanted into the surface of the n-type growth layer 6.

Photolithography and dry etching or the like are used to form the trench 11. Next, chemical vapor deposition (CVD) or the like is used to deposit an insulating film. Thereafter, photolithography and dry etching or the like are used to embed a polysilicon layer in the trench 11 to form a gate structure made of the gate insulating film 12 and gate electrode 13. Afterwards, photolithography and ion implantation or the like are used to provide the JTE region 18 inside the growth layer 6 going from the bottom end of the mesa inclined surface formed in the termination region 42 toward the outer edge of the termination region 42. At such time, a p-type impurity is implanted into the mesa inclined surface with the ion implantation for the formation of the JTE region 18. The impurity density of the p-type ion implantation for forming the JTE region 18 is around $2 \times 10^{17}$ cm$^{-3}$, for example. The p-type base region 8 has an impurity density of around $4 \times 10^{17}$ cm, and thus, after ion implantation for forming the JTE region 18, the p-type impurity density is around $6 \times 10^{17}$ cm$^{-3}$ and thus not a high impurity density.

As described above, the method of manufacturing the conventional MOSFET uses a mask in the source region 10 ion implantation step. On the other hand, in the method of manufacturing the MOSFET according to the present invention, ion implantation is performed on the entire surface to form the source region 10 without using a mask. Accordingly, the number of the mask layers is reduced, and mask alignment is also unnecessary. As a result, it is possible to shorten the manufacturing process and also to reduce manufacturing costs.

Other Embodiments

The present invention was described using the embodiment above, but the descriptions and drawings forming this part of the disclosure should not be construed as limiting the present invention. Various substitute embodiments, examples, and applied techniques should be clear to a person skilled in the art based on this disclosure.

In the embodiment of the present invention, a MISFET having a trench structure was shown as an example, but the present invention is not limited to this and can be applied to a semiconductor device having various types of trench structures such as an IGBT with a trench structure. The trench gate IGBT can be a structure in which the n$^+$ source region 8 of the MISFET shown in FIG. 1 is the emitter region, and a p+ collector region is provided on the bottom surface side of the drift layer 2 instead of the n+ drain region 1.

In the embodiment of the present invention, an example was shown in which the semiconductor device uses SiC, but the present invention can be applied to semiconductor devices using other wide bandgap semiconductors, such as gallium nitride (GaN) or diamond.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a drift layer of a first conductivity type;
   a current spreading region of the first conductivity type provided on the drift layer and having a higher impurity density than the drift layer;
   a base region of a second conductivity type provided on the current spreading region, such that the current spreading region is between the drift layer and the base region;
   a base contact region of the second conductivity type provided in a top part of the base region and having a higher impurity density than the base region;
   an electrode contact region of the first conductivity type provided in a top part of the base region that is laterally in contact with the base contact region, the electrode contact region having a higher impurity density than the drift layer;
   a relaxation region of the second conductivity type having a higher impurity density than the base region and contacting a bottom surface of the base region; and
   a MOS gate structure having a gate electrode and a gate insulating film sandwiched between the gate electrode and a face of the base region so as to create a channel adjacent to the face of the base region,
   a termination section at a periphery of the device having a mesa structure, wherein the mesa structure has a mesa side surface and a mesa bottom surface;
   a mesa bottom surface region and a channel stopper region, both having the first conductivity type and defining the mesa bottom surface;
   wherein the channel stopper region has a higher doping density than the mesa bottom surface region and reaches an outer edge of the mesa bottom surface, and
   wherein a density of a second conductivity type impurity element in the base contact region is at least two times as much as a density of a first conductivity type impurity element in the electrode contact region.

2. The semiconductor device according to claim 1, wherein the mesa structure includes a mesa inclined surface exposing a lateral end of the base contact region and a lateral end of the base region.

3. The semiconductor device according to claim 2, wherein the relaxation region of the second conductivity type has a higher impurity density than the base region and contacts a bottom surface of the base region, and said mesa inclined surface exposes at least a portion of a lateral end of the relaxation region.

4. The semiconductor device according to claim 2, wherein the mesa bottom surface region of the first conductivity type is laterally in contact with the relaxation region, a top surface of the mesa bottom surface region defining at least a portion of the mesa structure.

5. The semiconductor device according to claim 4, wherein the mesa bottom surface region includes a junction termination extension region.

6. The semiconductor device according to claim 4, wherein a depth from a top surface of the base contact region to a bottom of the current spreading region is the same as a depth from a top surface of the base contact region in the termination section to a bottom of the channel stopper region.

7. The semiconductor device according to claim 4, wherein an impurity density of the current spreading region is the same as an impurity density of the channel stopper region.

8. The semiconductor device according to claim 1, wherein the density of the second conductivity type impurity element in the base contact region is equal to or greater than $1 \times 10^{20}$ cm-3, and the density of the first conductivity type impurity element in the electrode contact region is equal to or less than $10 \times 10^{19}$ cm-3;
   wherein the base contact region contains, in addition to the second conductivity type impurity element, said first conductivity type impurity element in a same amount as an amount of the first conductivity type element contained in the electrode contact region, and a density of the first conductivity type impurity element in the base contact region is lower than the density of the second conductivity type impurity element in the base contact region, and
   wherein in a depth direction of the base contact region, the density of the second conductivity type impurity element is always at least two times as much as the density of the first conductivity type impurity element.

* * * * *